United States Patent [19]

Deyhimy et al.

[11] 4,285,000

[45] Aug. 18, 1981

[54] BURIED CHANNEL CHARGE COUPLED DEVICE WITH SEMI-INSULATING SUBSTRATE

[75] Inventors: Ira Deyhimy; Richard C. Eden; James S. Harris, Jr.; Lucia O. Bubulac, all of Thousand Oaks, Calif.

[73] Assignee: Rockwell International Corporation, El Segundo, Calif.

[21] Appl. No.: 19,807

[22] Filed: Mar. 12, 1979

[51] Int. Cl.$^3$ .................... H01L 29/78; H01L 29/56; H01L 29/06; G11C 19/28
[52] U.S. Cl. ...................................... 357/24; 357/15; 357/56; 307/221 D
[58] Field of Search ................. 357/24, 15; 307/221 D

[56] References Cited

U.S. PATENT DOCUMENTS

| | | | |
|---|---|---|---|
| 3,700,932 | 10/1972 | Kahng | 357/24 |
| 3,739,240 | 6/1973 | Krambeck | 357/24 |
| 3,965,481 | 6/1976 | Esser | 357/24 |
| 3,986,197 | 10/1976 | Ablassmeier | 357/24 |
| 4,012,759 | 3/1977 | Esser | 357/24 |
| 4,032,952 | 6/1977 | Ohba et al. | 357/24 |
| 4,151,539 | 4/1979 | Barron et al. | 357/24 |

OTHER PUBLICATIONS

Deyhimy et al., "GaAs Charge-Coupled Devices", Applied Physics Lett., vol. 32, (15 Mar. 78), pp. 383–385.
Milnes et al., *Heterojunctions and Metal-Semiconductor Junctions,* Academic Press, (1972), p. 8.
Hartnagel et al., "Increased Signal Speed By GaAs CCD's", AEU vol. 29, (1975), pp. 286–288.
Tuyl et al., "High-Speed Integrated Logic With GaAs Mesfet's", IEEE J. Solid-State Circuits, vol. SC-9, (10/74), pp. 269–276.
Hughes et al., "A CCD on Gallium Arsenide", Int. Conf. Tech. and Applications Charge Coupled Devices, Edinburgh (9/74), Proc., pp. 270–273.
Scheurmeyer et al., "New Structures For Charge-Coupled Devices", Proc. IEEE, vol. 60, (11/72), pp. 1444–1445.
Kellner et al., "A Schottky-Barrier CCD on GaAs", IEEE Int. Electron Devices Meeting, (12/77), Session 24, Paper 24.7, pp. 599–600.

Primary Examiner—Gene M. Munson
Attorney, Agent, or Firm—H. Fredrick Hamann; Craig O. Malin

[57] ABSTRACT

A charge coupled device has a semi-insulating semiconductor for a substrate. Resistivity of the semiconductor is at least $10^6$ ohm cm. A semi-conductive layer is grown epitaxially or is implanted on the substrate to form a thin, active, charge transport layer. A row of parallel, closely spaced gates on the charge transport layer provides individual storage wells in the charge transport layer. In a preferred embodiment, ohmic contacts adjacent the first and last gates in the row of gates provide a means for injecting a signal into the charge transport layer and a means for detecting the signal. Preferably, the substrate is semi-insulating GaAs and the gates are Schottky barrier gates.

5 Claims, 6 Drawing Figures

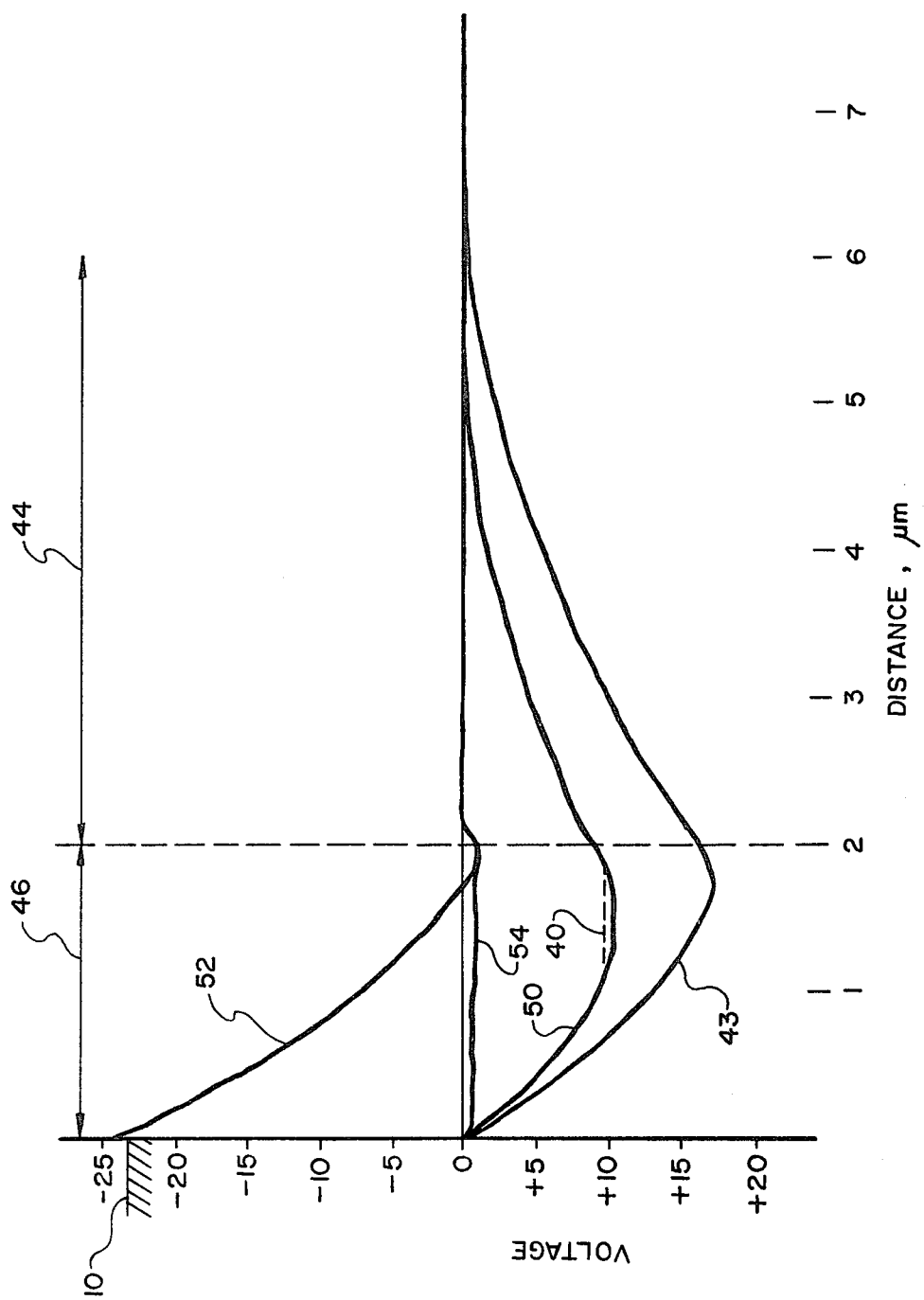
Fig. 5. (PROPOSED IN PRIOR ART)

BURIED CHANNEL CHARGE COUPLED DEVICE WITH SEMI-INSULATING SUBSTRATECL

BACKGROUND OF THE INVENTION

1. Field of the Invention

This invention relates to the field of solid state electronics and particularly to the field of charge coupled devices (CCDs.)

2. Description of the Prior Art

Conventional charge coupled devices (CCDs) utilize a silicon substrate with a layer of insulation (silicon dioxide) covering the substrate. Metal electrodes are deposited in a row on top of the insulating layer to move charges which are stored at the semiconductor-insulator interface. U.S. Pat. No. 3,654,499 to G. E. Smith describes the structure and operation of such prior art metal insulator semiconductor CCD or MIS CCD.

In an attempt to improve the efficiency of such MIS CCDs, buried channel CCDs have been designed as described in U.S. Pat. No. 3,739,240 to R. H. Krambeck. Buried channel CCDs store charges in the bulk of an active layer rather than in a MIS interface. Higher speeds and better efficiency should be obtainable in buried channel CCDs because of the elimination of surface state trapping of charges at the insulator semiconductor interface. Such buried channel CCDs have been proposed utilizing Schottky barrier gates on an active n-type conductivity layer formed on a p-type conductivity silicon substrate.

Despite these developments, ultra-high speed signal processing is difficult (if not impossible) to achieve with silicon technology as a direct consequence of silicon material properties, i.e., energy-gap and carrier mobility. In an attempt to overcome the limitation of silicon as a CCD material, Schuermeyer et al. have proposed the fabrication of a CCD on a p-type, semi-conductive GaAs substrate (Proc. IEEE 60, 1444, 1972). Schuermeyer et al. speculate about a CCD utilizing Schottky-barrier gates on an n-type conductivity charge transport layer formed on a p-type conductivity GaAs substrate. Because of the conductivity of the substrate used, such a CCD would require a channel stop to isolate the active charge transfer channel and stops to isolate any other active device built upon the substrate to support the CCDs' electronics.

SUMMARY OF THE INVENTION

It is an object of the invention to provide an improved CCD.

It is an object of the invention to provide a high speed CCD.

It is an object of the invention to provide an efficient CCD.

It is an object of the invention to provide a CCD which does not require a channel stop to isolate the active charge transfer channel.

It is an object of the invention to provide a CCD on a substrate of a semi-insulating semiconductor.

According to the invention, a semi-conducting, charge transport layer is grown expitaxially or implanted on a semi-insulating substrate of a semi-conductor such as GaAs or CdTe. The semiconductor forming the substrate has a resistivity of at least $10^6$ ohm cm so that the charge transport layer or channel is isolated on the substrate without the use of channel stops.

A row of parallel, closely spaced gates is formed on the charge transport layer utilizing Schottky barriers or p-n junctions.

Ohmic contacts are provided in the charge transport layer adjacent the first and last gates in the row of gates for injecting a signal into the charge transport layer and for detecting the signals.

These and other objects and features of the present invention will be apparent from the following detailed description, taken with reference to the accompanying drawings.

BRIEF DESCRIPTION OF THE DRAWINGS

FIG. 5 is a potential profile for a CCD such as proposed in the prior art having a semi-conducting substrate.

DESCRIPTION OF THE PREFERRED EMBODIMENT

Figure 1:
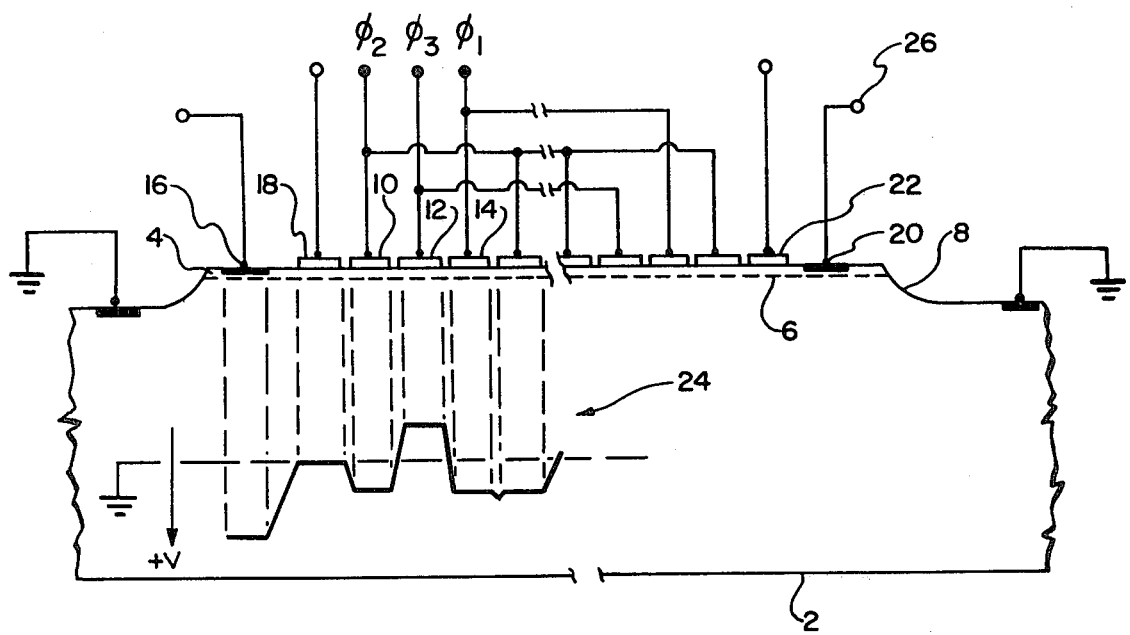
FIG. 1 is a partial, schematic side view of a charge coupled device (CCD) according to the invention with an insert showing the potential profile along the transport layer.

FIG. 1 is a shematic side view of a CCD according to the invention. An important feature of such a CCD is the utilization of a semi-insulating semiconductor for substrate 2. Although the substrate has the relatively narrow energy gap typical of all semiconductors (as compared to the large energy gap of insulators), it also has a relatively high resistance (as compared to conventional semiconductors). Active devices can be constructed on the substrate by implanting donor or acceptor ions into it or by growing an epitaxial layer on it, and these active devices are isolated from each other by the high resistance of the substrate.

GaAs and CdTe are examples of semi-insulating semiconductors that are available with sufficiently high resistance to be applicable for substrates according to the invention, although any semiconductor with a resistance of at least $10^6$ ohm cm should be applicable. U.S. Pat. No. 3,914,784 to R. G. Hunsperger et al gives examples of GaAs substrates exhibiting bulk resistivities greater than $10^6$ ohm cm that are used in a preferred embodiment of the invention. Such semi-insulating GaAs is obtained by introducing specific amounts of chromium and oxygen into the GaAs melt to raise its resistance.

As shown in FIG. 1, a thin, active, charge transport layer 4 is formed on substrate 2. Layer 4 is formed by doping the surface of the substrate with donor or acceptor ions utilizing epitaxial growth, ion implantation, or other doping techniques well known in the art. Although charge transport layer 4 may be doped to be either n-type conductivity or p-type conductivity, the preferred embodiments described in this specification are of n-type conductivity ($N_D = 10^{16}$ per $cm^3$) because of the higher mobility of the electrons, which are the majority carriers in n-type semi-conductors.

Since substrate 2 as used in the CCD is a semi-insulator, it does not have an effective conductivity type.

Thus junction 6 is not a p-n junction but rather a junction between an n-type conductivity semiconductor and a non-conducting semiconductor.

In the example shown in FIG. 1, charge transport layer 4 is isolated from substrate 2 by etching away portions of the upper surface in a known manner to form mesa 8. Alternatively, a planar configuration may be used by doping only a portion of the upper surface of substrate 2. Then, the boundaries of the active charge transport layer are the edge of the doped area rather than the periphery of mesa 8.

Gates for the CCD are provided by Schottky barrier gates 10, 12, 14 which repeat along the length of the channel and are used to apply a three phase clocking cycle to move a charge down the channel in a manner well known in the art.

Figure 1A:
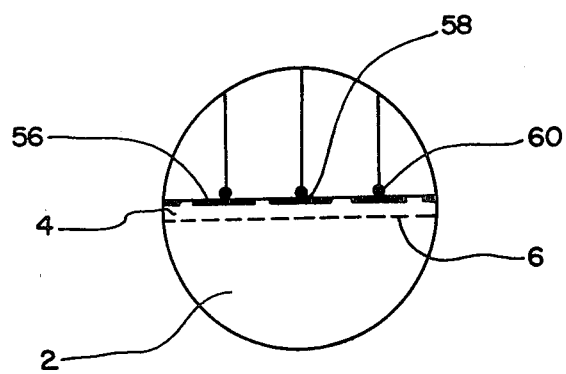
FIG. 1A shows p-n junctions used as gates in a second embodiment of the invention.

In a second embodiment, p-n junction gates 56, 58, 60 formed by doping charge transport layer are used rather than Schottky barrier gates 10, 12, 14 as shown in detail FIG. 1A. The p-n junction gate embodiment operates similarly to the Schottky barrier gate embodiment.

Ohmic contact 16 in active layer 4 is used in conjunction with first Schottky barrier gate 18 to inject a charge or signal into the channel under gates 10–14, and ohmic contact 20 is used in conjunction with last Schottky gate 22 to sense the signal after it has travelled through the channel. The input and output ohmic contacts 16, 20 are normally held at a large positive bias (approximately +30 V) with respect to grounded substrate 2, while the first and last Schottky gates 18, 22 are dc biased near 0V to form barriers. The gates in-between are pulsed with a three-phase clock ($\pm 5$ V), phase to ensure unidirectional flow of charge. Other number of phases such as 4 phase is possible.

To inject a signal in the CCD, the potential of input ohmic contact 16 is momentarily lowered from +30 V to −5 V and returned to +30 V. This input pulse is synchronized to occur when the first clocked gate ($\phi_2$ in the illustrated case) is positive, thus creating a potential well in the semi-conductor under the gate. The potential profile along the channel shortly before the application of an input pulse is shown as insert 24 in FIG. 1. In this way, a pulse can be injected every time $\phi_2$ positive. The output signal current is sensed at output 26 after the last clocked gate 22 makes a positive-to-negative transition.

Figure 2:
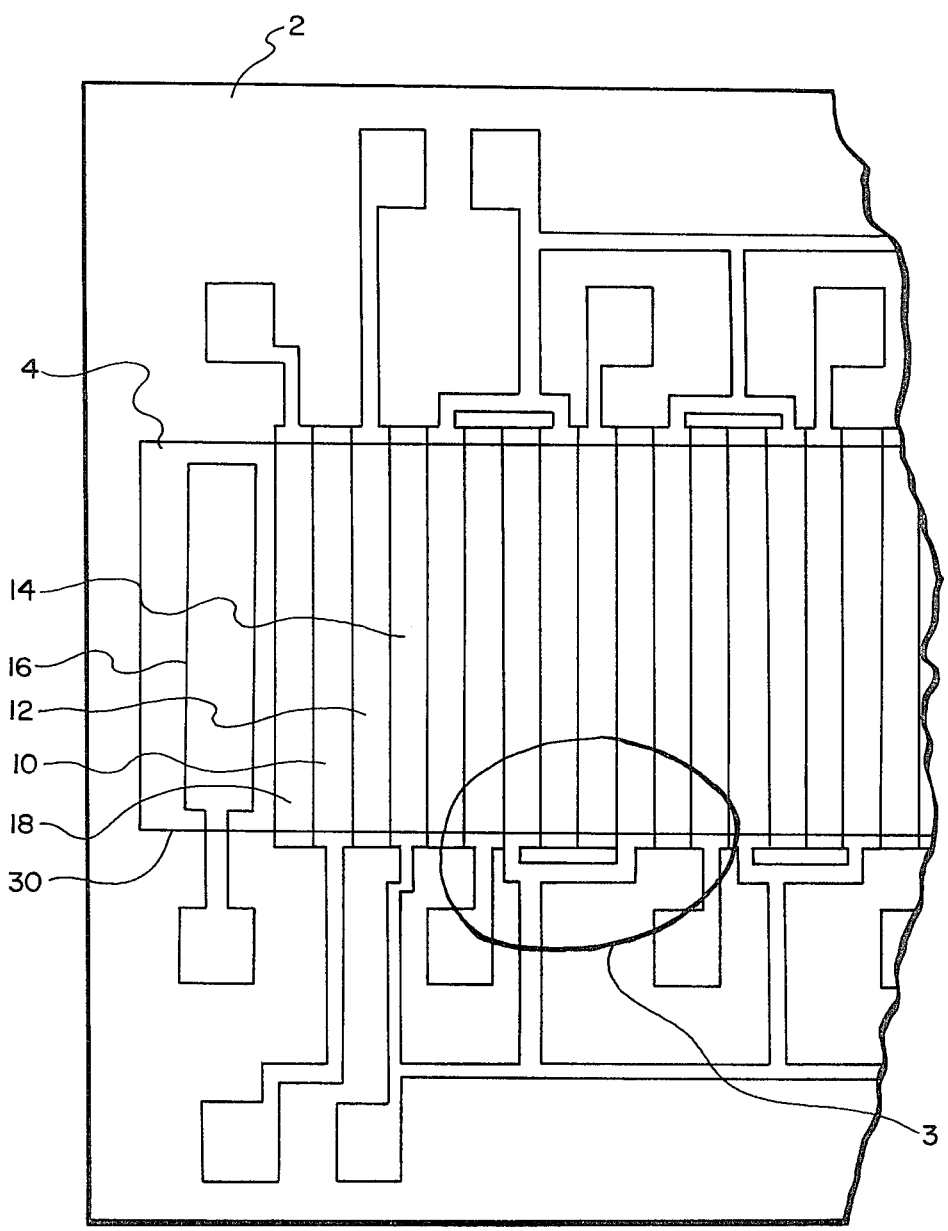
FIG. 2 is a partial top view of a CCD such as shown in FIG. 1.

FIG. 2 is a top view of a CCD configuration fabricated to demonstrate its operation. An n-type ($N_D = 10^{16}$ per cm$^3$)GaAs charge transport layer 1.5 to 2.0 $\mu$m thick is epitaxially grown on a Cr-doped (semi-insulating) GaAs substrate. The active area 4 of the device is within the rectangle delineated by periphery 30. In the example of FIG. 2, periphery 30 is the edge of mesa 4. However, the CCD in FIG. 2 could have been formed by ion-implanting the area within periphery 30 with a donor dopant. In such embodiment, the CCD would be planar and periphery 30 would simply be the boundary between the implanted active region 4 and the insulating substrate 2.

Ohmic contact 16 is formed on the active region at one end of the mesa (other end is not shown in FIG. 2). Schottky barrier gates 18, 10–14 of Cr-Au are vacuum evaporated on the charge transport layer 4 so that they extend a distance "d" beyond semi-conducting layer 4 onto insulating substrate 2 and thus form channel stops. This important and useful feature is shown more clearly in FIG. 3 which is an enlargement of portion III of FIG. 2.

Figure 3:
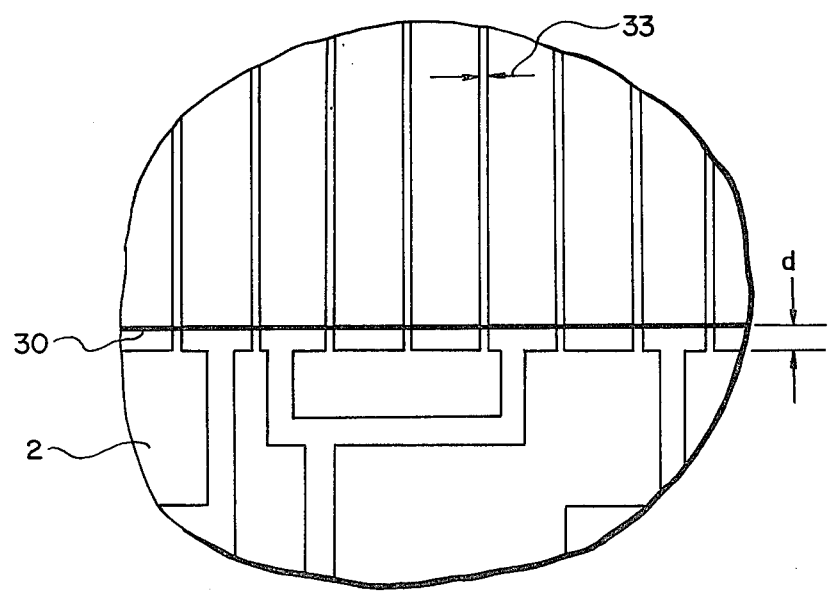
FIG. 3 is an enlargement of portion III shown in FIG, 2.

In the device shown in FIGS. 2 and 3, there are 30 Schottky gates interconnected on semi-insulating substrate 2 as a 3-phase CCD. The gates are 400 $\mu$m long by 40 $\mu$m wide and are separated by gaps 33 of 2.0 $\mu$m. Thus, for the 1.5 to 2 $\mu$m thick active transport layer 4, the thickness to gap ratio is about 0.7 to 1.

Figure 4:
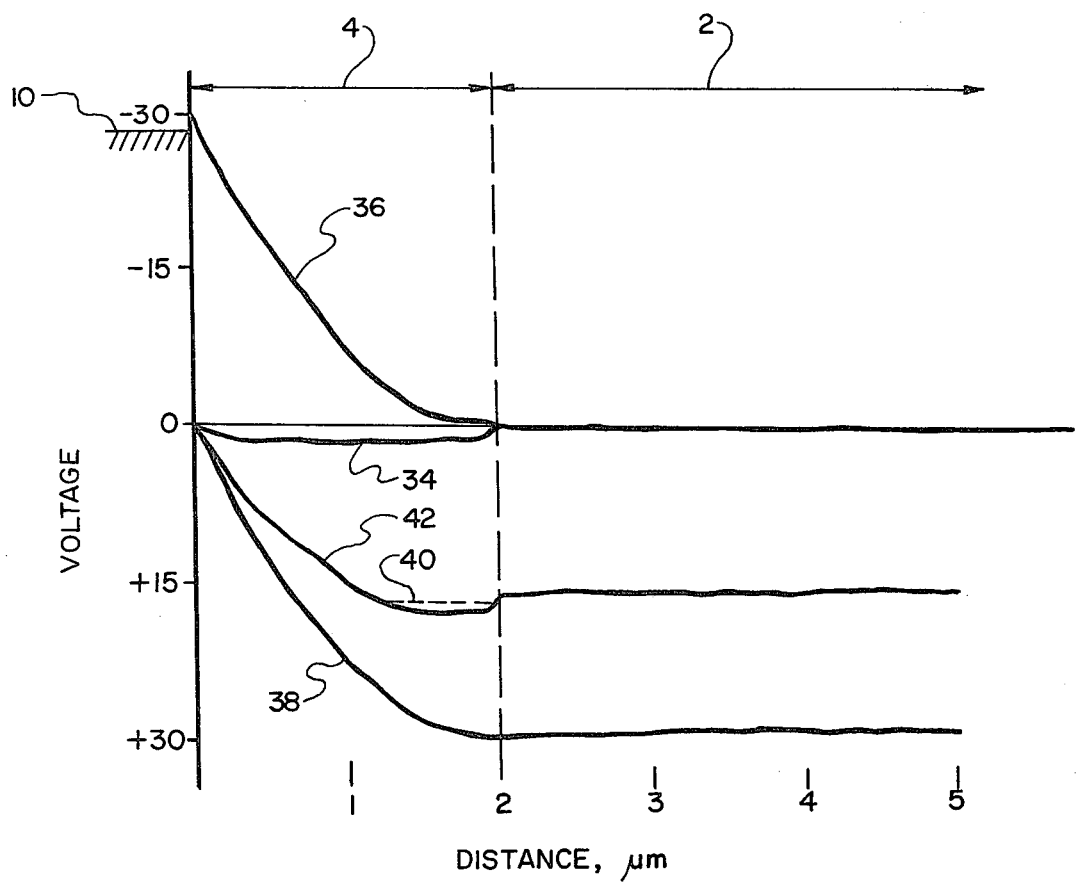
FIG. 4 is a potential profile for a CCD such as shown in FIG. 1 having a semi-insulating substrate.

The operation of the device can be understood by a study of the potential profile of a cross section of the device under a gate as shown in FIG. 4. Distance across the section is shown as the abcissa and voltage is shown as the ordinate. To the left of the ordinate is Schottky gate 10 whose barrier height has been measured using C-V data to be 0.9 eV with an ideality factor of 1.06. Directly under Schottky gate 10 is n-type conductivity charge transport layer 4 with a thickness of 2 $\mu$m and then semi-insulating substrate 2. Initially (at thermal equilibrium), with no bias applied, the n-layer is partially depleted from both sides due to the built-in junction potentials, as shown by curve 34.

When the maximum (negative) "push-clock" voltage is applied to the gate, the minimum potential in the channel is raised so that all the mobile electrons are removed to the adjacent gate ($N_e=0$) as shown by profile 36. Biasing output ohmic contact 20 to the layer positively results in the mobile charges being quickly "pumped" out of the device.

As the push-clock bias is reduced to zero, the potential maximum returns to a large positive value which corresponds to an empty well ($N_e=0$) as shown by profile 38. This well is then ready to store charge created by photogeneration, injection, or thermally generated dark current. The potential distribution for a well partially filled with charge 40 (charge capacity=$N_e=5\times 10^{11}$/cm$^2$ of gate area) is shown by curve 42.

For comparison, FIG. 5 shows potential profiles for a Schottky barrier gate CCD with a p-type conductivity substrate 44 (rather than a semi-insulating substrate) such as proposed by Schuermeyer et al, op cit. The CCD in FIG. 5 has a 2 $\mu$m thick n-type conductivity charge transfer layer with a donor concentration of $N_D = 10^{16}$/cm$^3$. However, the prior art proposed CCD has a p-type conductivity substrate 44 with an ionized acceptor concentration of $N_A = 10^{15}$/cm$^3$. Because substrate 44 is semiconducting, profile 48 for an empty well ($N_E=0$), and profile 50 for a well partially filled with charge 40 ($N_E=5\times 10^{11}$/cm$^2$) have the convential bucket shape considered necessary in the prior art to store charges. The profile 52 for maximum voltage and the profile 54 for thermal equilibrium are similar in FIGS. 4 and 5.

The structure of the present CCD is most suitable for high speed applications where relatively short (approximately 1 sec) charge storage time is adequate. The semi-insulating substrate is advantageous because it provides a natural channel stop, makes possible a very small detection node capacitance (typically 0.01 pF), and helps reduce the power dissipation in the clock drivers. The power dissipation in the clock drivers for conventional CCD's is one limitation to their high speed (>100 MHZ) operation.

One important consideration for a high speed CCD is the on-chip field effect transistor (FET) preamplifier. FET preamplifiers with high $f_\tau$ (unity current gain cutoff frequency) necessary for high speed CCD operation can be constructed on the GaAs substrate.

Numerous variations and modifications may be made without departing from the present invention. Accordingly, it should be clearly understood that the form of the present invention described above and shown in the accompanying drawings is illustrative only and is not intended to limit the scope of the present invention.

What is claimed is:

1. A charge coupled device comprising:
   a substrate of a semi-insulating, semiconductor having a resistivity of at least $10^6$ ohm centimeters;
   a doped layer of said substrate forming a semiconducting charge transport layer of a first conductivity type covering only a portion of a surface of said substrate so that there is an interface on the surface of said device between said charge transport layer and said substrate;
   a row of parallel, closely spaced p-n junction gates on said charge transport layer each of said gates overlapping said interface so that charges are confined within said charge transport layer without the need of a channel stop because of the resistivity of said substrate;
   input means for injecting a signal into said charge transport layer under one of said gates; and
   output means for detecting said signal from said charge transport layer.

2. A charge coupled device comprising:
   a semi-insulating GaAs substrate having a resistivity of at least $10^6$ ohm centimeters;
   an n-type, semi-conducting GaAs charge transport layer having a thickness of less than about 5 $\mu$m and covering only a portion of a surface of said substrate so that there is an interface on the surface of said device between said charge transport layer and said substrate;
   a row of parallel, closely spaced Schottky barrier gates on said charge transport layer, each of said gates overlapping said interface and being spaced from each other by a distance less than said thickness of said transport layer;
   input means for injecting a signal into said charge transport layer under one of said gates; and
   output means for detecting said signal from said charge transport layer.

3. A charge coupled device comprising:
   a substrate of a semi-insulating, semiconductor having a resistivity of at least $10^6$ ohm centimeters;
   a doped layer of said substrate forming a semi-conducting charge transport layer of a first conductivity type covering only a portion of a surface of said substrate so that there is an interface on the surface of said device between said charge transport layer and said substrate;
   a row of parallel, closely spaced Schottky barrier gates on said charge transport layer each of said gates overlapping said interface so that charges are confined within said charge transport layer without the need of a channel stop because of the resistivity of said substrate;
   input means for injecting a signal into said charge transport layer under one of said gates; and
   output means for detecting said signal from said charge transport layer.

4. The device as claimed in claims 1 or 3, wherein said charge transport layer is a mesa on said substrate and said interface on the surface of said device is the periphery of said mesa.

5. The device as claimed in claims 1 or 3, wherein said charge transport layer is an ion implanted region on said surface of said substrate and said interface on the surface of said device is the periphery of said ion implanted region.

* * * * *